United States Patent
Masleid (10) Patent No.: US 6,525,354 B2
(45) Date of Patent: Feb. 25, 2003

(54) FET CIRCUIT BLOCK WITH REDUCED SELF-HEATING

(75) Inventor: Robert P. Masleid, Monte Sereno, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/844,788

(22) Filed: Apr. 27, 2001

(65) Prior Publication Data

US 2002/0158276 A1 Oct. 31, 2002

(51) Int. Cl.[7] .............................................. H01L 29/76
(52) U.S. Cl. ...................... 257/288; 257/77; 257/347; 257/350; 257/353; 257/382; 257/712
(58) Field of Search ........................ 257/77, 347, 350, 257/353, 382, 712, 713, 758

(56) References Cited

U.S. PATENT DOCUMENTS 5,955,781 A  * 9/1999 Joshi et al. .................. 257/347
6,100,199 A    8/2000 Joshi et al. .................. 438/694
6,121,659 A    9/2000 Christensen et al. ........ 257/347

OTHER PUBLICATIONS

Anantha Chandrakasan, William J. Bowhill, Frank Fox "Design of High–Performance Microprocessor Circuits", 2001 Institute of Electrical and Electronics Engineers, Inc. New York, NY, 5 pages.

Kerry Bernstein, Norman J. Rohrer, "SOI Circuit Design Concepts", IBM Microelectronics, 6 pages.

* cited by examiner

Primary Examiner—David Nelms
Assistant Examiner—Mai-Huong Tran
(74) Attorney, Agent, or Firm—Fenwick & West LLP (57) ABSTRACT

A field effect transistor (FET) is disclosed that includes a heat spreader adapted to reduced the thermal resistance and channel operating temperature of a field effect transistor used in a circuit block susceptible to self-heating effects. In one embodiment, regulatory circuit blocks of an integrated circuit, such as phase locked loops, utilize the FET to improve the characteristics of a regulatory output required by other circuit blocks, such as digital logic circuits. In one embodiment the FET is a silicon-on-insulator structure.

17 Claims, 5 Drawing Sheets

FET CIRCUIT BLOCK WITH REDUCED SELF-HEATING

BACKGROUND OF THE INVENTION

1. Field of the Invention

The present invention is generally directed towards reducing deleterious self-heating of FETs in a circuit block of an IC. More particularly, the present invention is directed towards advantageously improving the thermal characteristics of FETs in selected circuit blocks of a microprocessor, such as the control circuits of a silicon-on-insulator (SOI) microprocessor.

2. Description of Background Art

High-speed microprocessors are of interest for a variety of applications. Conventionally, reductions in transistor gate dimensions have been associated with improvements in device performance. The transistors of a a high frequency microprocessor typically have a gate length less than 0.2 microns. For example, advances in device processing, such as deep ultraviolet lithography, permit the gate length of the transistors of a digital logic circuit to be decreased to less than 0.15 microns, thereby improving the maximum cycle rate of digital logic circuits.

Figure 1:
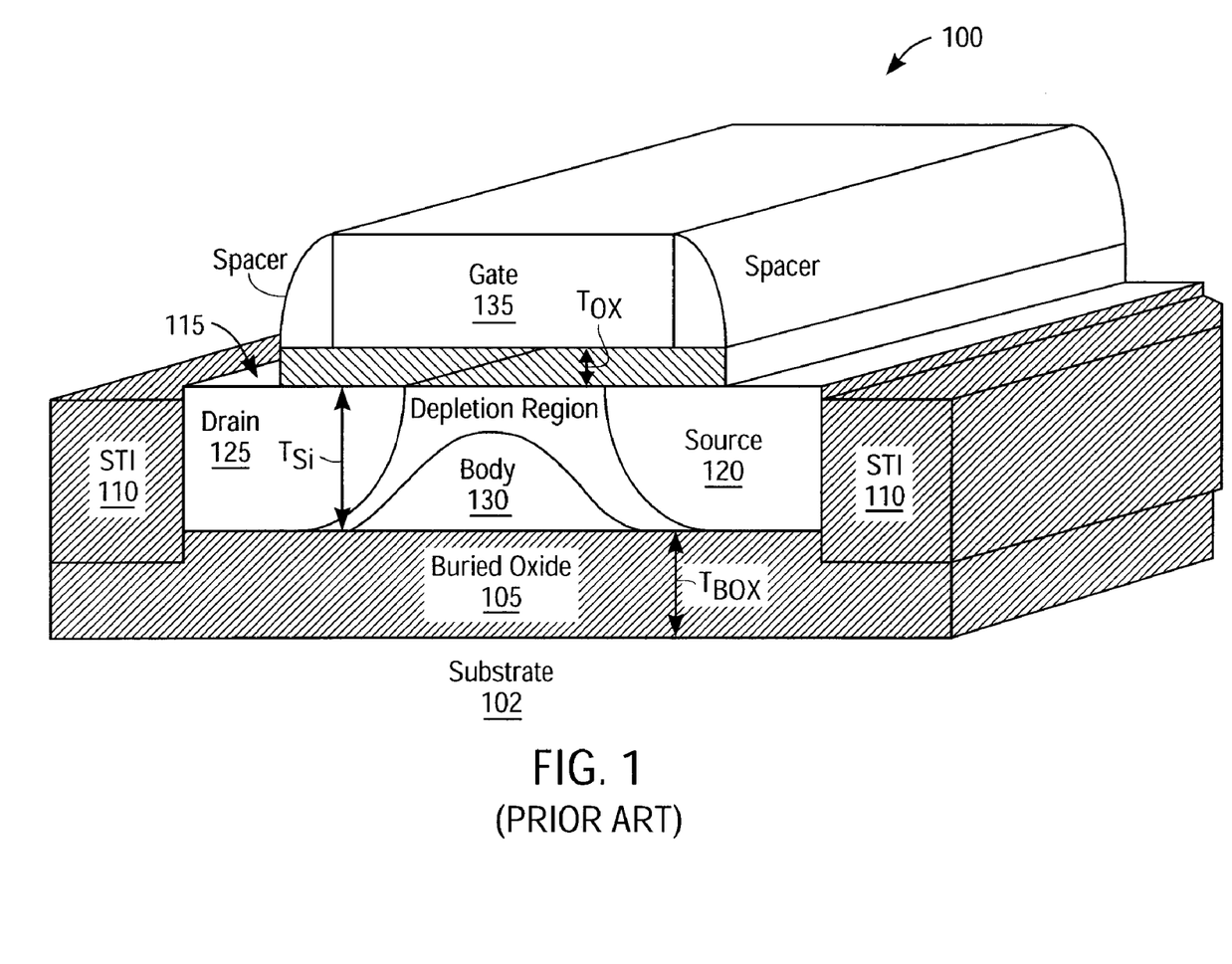
FIG. 1 is a cut-away diagram of a prior art silicon-on-insulator field effect transistor.

Additionally, the use of materials structures that reduce parasitic effects have been associated with increases in transistor speed. In particular, high frequency microprocessors increasingly use a silicon-on-insulator (SOI) field effect transistor (FET) structure. Conventional SOI logic circuits are typically capable of operating at clock, cycles up to 20–35% faster than microprocessors fabricated on bulk silicon having comparable gate dimensions. FIG. 1 shows a cross-section of a conventional SOI transistor 100. A buried oxide layer 105 is formed on a silicon substrate 102. A shallow trench isolation (STI) region 110 is formed on both ends of a silicon layer 115. Conventional semiconductor fabrication techniques are used to form a source diffusion region 120 and a drain diffusion region 125 defining a channel region 130 whose conductivity is controlled by a gate 135.

Conventionally, the temperature rise ("self-heating") of the channel of each FET of a microprocessor is typically assumed to have an insignificant effect in regards to the overall performance of the integrated circuit. However, there is increasing interest in the microprocessor industry in fabricating high frequency microprocessors operating at a clock cycle frequency of greater than one gigahertz. However, in order to operate a microprocessor at a high clock cycle frequency, the gate length of the transistors needs to be reduced to below about 0.15 microns. This increases the thermal resistance of each FET, since the thermal resistance of a FET tends to increase inversely with decreases in channel area. Moreover, the use of transistor structures having thermally insulating layers increases the thermal resistance of a FET. In particular, SOI transistors tend to have a high thermal resistance because of the extra thermal resistance created by the buried oxide layer 105 underneath the channel and the STI regions 110, which blocks the flow of heat from the channel. Silicon dioxide has a thermal conductivity of 1.4 W/(mK), which is over a factor of 60 lower than the thermal conductivity of silicon, which is 85 W/(mK). Consequently, buried oxide layer 105 significantly increases the thermal resistance of the FET.

Therefore, there is a need for an improved technique to reduce self-heating of the transistors in a circuit block of a high frequency integrated circuit, particularly a circuit having SOI FETs.

SUMMARY OF THE INVENTION

A field effect transistor structure having reduced self-heating and its application in selected circuit blocks of an integrated circuit is disclosed. A field effect transistor of the present invention has a semiconductor layer disposed on a substrate, a drain diffusion region formed in the semiconductor layer, a source diffusion region formed in the semiconductor layer, and a gate structure defining a channel region between the drain diffusion region and the source diffusion region. One of the diffusion regions has an area greater than an area associated with the channel region and forms a thermal transfer region for the lateral flow of heat from the channel through the thermal transfer region to the substrate. A heat spreader is disposed on the surface of the semiconductor layer of the thermal transfer region. In one embodiment, the heat spreader includes metal contact layers and interconnects configured to spread heat across the thermal transfer region. The thermal transfer region and heat spreader reduce the thermal resistance and operating temperature of the channel region. In one embodiment the thermal transfer region and heat spreader are configured to reduce the thermal resistance of the channel regions by at least a factor of two. In one embodiment, the field effect transistor of the present invention is used in a circuit block having a circuit output with characteristics that degrade with increasing self-heating, thereby improving the characteristics of the output.

In one embodiment, a circuit block of an integrated circuit incorporates the field effect transistors of the present invention. In a microprocessor application, the integrated circuit includes a processor block having a digital logic circuit with transistor gate length consistent a desired clock cycle frequency. A regulatory circuit block provides a regulatory output for the integrated circuit to be operable at the clock cycle frequency. The regulatory output has characteristics that degrade with self-heating. Field effect transistors in the regulatory circuit that are susceptible to self-heating effects utilize the field effect transistor structure of the present invention, thereby reducing self-heating effects in the regulatory circuit block that may degrade the output characteristics of the regulatory circuit block.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

The figures depict a preferred embodiment of the present invention for purposes of illustration only. One of skill in the art will readily recognize from the following discussion that alternative embodiments of the structures and methods disclosed herein may be employed without departing from the principles of the claimed invention.

DETAILED DESCRIPTION OF THE PREFERRED EMBODIMENTS

Figure 2:
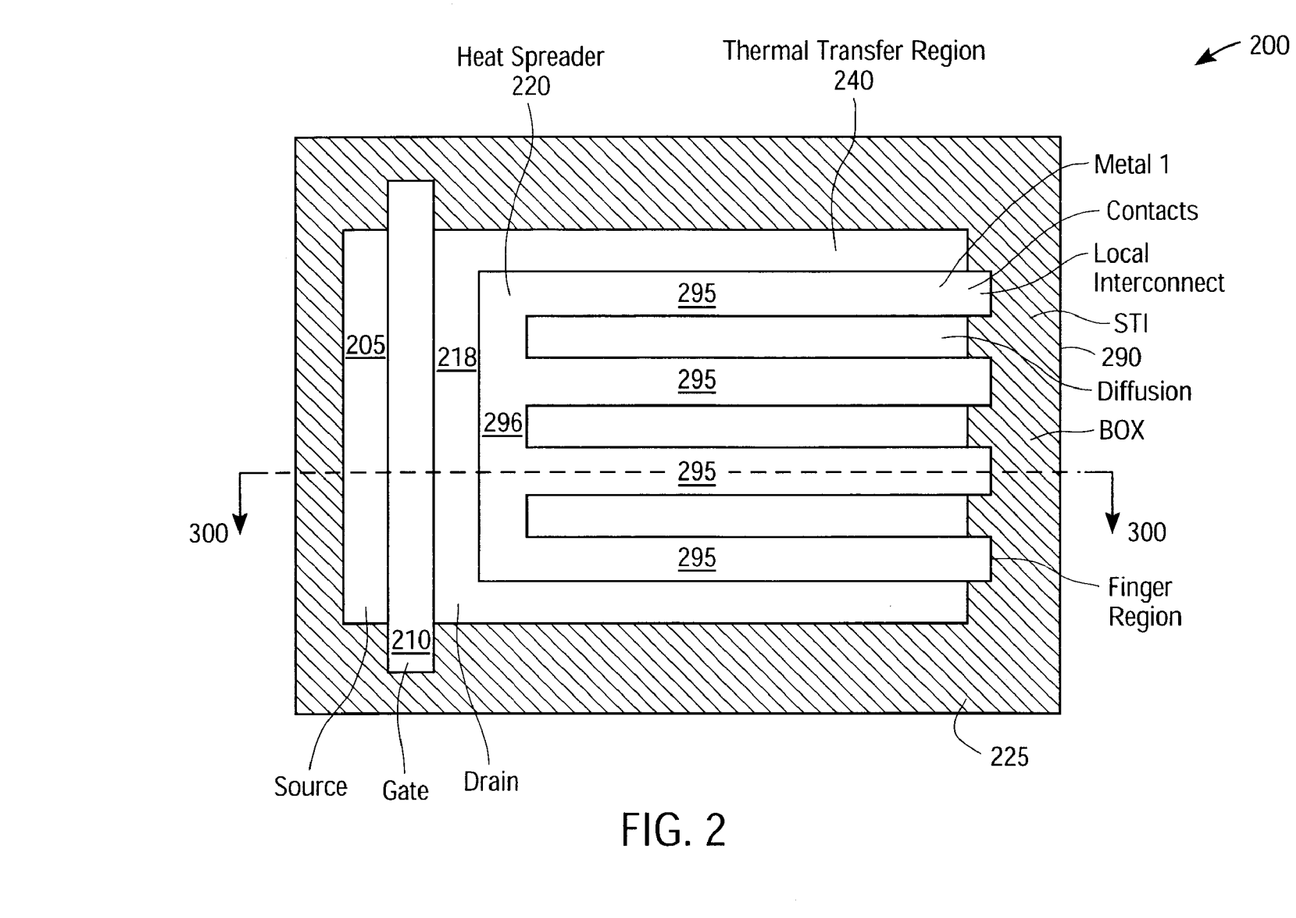
FIG. 2 is a top view of a field effect transistor of the present invention including a thermal transfer region and integrated heat spreader.
Figure 3:
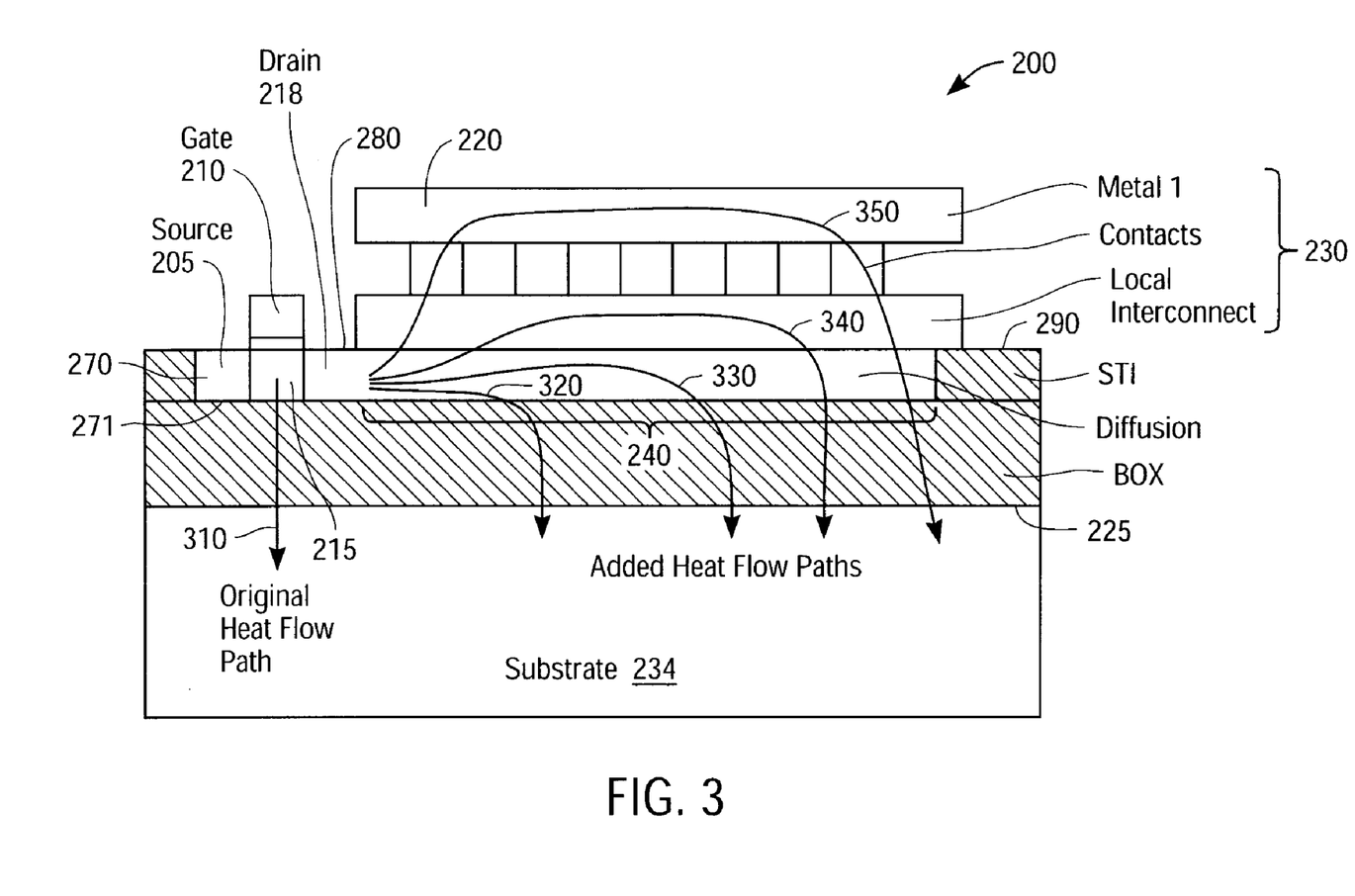
FIG. 3 is a cross-sectional view along line 300—300 of FIG. 2.

The present invention includes a technique for reducing self-heating effects in the transistors of a circuit block, such as a regulatory circuit block in a high-speed microprocessor. FIG. 2 is a top view of an individual field effect transistor (FET) in accord with the present invention. FIG. 3 is a cross-sectional view along line 300—300. FET 200 has a gate 210 that forms a channel 215 (shown in FIG. 3) between a source 205 and drain 218 diffusion regions on a semiconductor layer 270 of a substrate 234. The gate 210 has a gate length and gate width defining a gate area. The channel 215 (under the gate) has a length that, to a first order approximation, scales with the gate length, i.e., the area of channel 215 can be approximated as being comparable to the area of gate 210.

In one embodiment, semiconductor layer 270 is composed of silicon. In a silicon-on-insulator (SOI) embodiment, a buried oxide layer 225 is disposed between a bottom surface 271 of a silicon layer 270 and substrate 234. In this embodiment, a shallow trench isolation (STI) region 290 is included along the sides of the transistor. A conventional silicon-on-insulator process may be used to form the buried oxide layer 225 and STI region 290.

FET 200 is adapted to reduce the thermal resistance of channel 215 by reducing the thermal resistance of the flow of heat laterally from the channel. One of the diffusion regions is preferably extended in area to form a thermal transfer region 240 in semiconductor layer 270 adjacent channel 215. A heat spreader 220 is disposed on the surface 280 of a portion of semiconductor layer 270 across the thermal transfer region 240 adjacent the channel 215. In one embodiment, thermal transfer region 240 is a conventional diffusion region (e.g., a drain diffusion) enlarged in area to form a region having an area much greater than the area of channel 215. Heat spreader 220 preferably comprises one or more metal contact or interconnect layers arranged to increase the flow of heat from channel 215 into thermal transfer region 240. As indicated in FIG. 2, in one embodiment, heat spreader 220 includes metal contact and interconnects configured spread heat across thermal transfer region 240. In one embodiment, heat spreader 220 includes finger regions 295 oriented perpendicularly with respect to a base 296 region that is adjacent channel 215. Since the semiconductor junction diffusion region of thermal transfer region 240 is comparatively large in area, parasitic loading may be increased. Consequently, in one embodiment, heat spreader 220 resides on an extended drain diffusion region, i.e., the signal contact (e.g., the source contact) is left unchanged to avoid parasitic loading of the circuit.

As indicated by arrow 310, heat may flow directly from channel 215 to substrate 234. However, as indicated by arrows 320, 330, 340, and 350 thermal transfer region 240 and heat spreader 220 provides alternate heat flow paths. In one embodiment, the heat spreader is comprised of metal interconnect and contact layers 230 on the surface of a thermal transfer region 240 disposed within a drain diffusion region 210 of semiconductor layer 270. As described below in more detail, the metal types, thickness of metal layers, and layout of heat spreader 220 are preferably selected to increase the thermal conductance of heat spreader 220 such that a significant fraction of the total heat flow from channel 215 to substrate 234 occurs through the thermal transfer region 240.

Heat spreader 220 preferably includes metals having a high thermal conductivity, such as copper metal layers. Copper, for example, has a thermal conductivity approximately four times greater than heavily doped silicon. Heat spreader 220 preferably encloses or has fingers 280 subtending a thermal transfer region 240 of FET 200 that is larger in area than the active channel under gate 210. In one embodiment, thermal transfer region 240 has an area approximately ten times that of the channel 215.

Figure 4A:
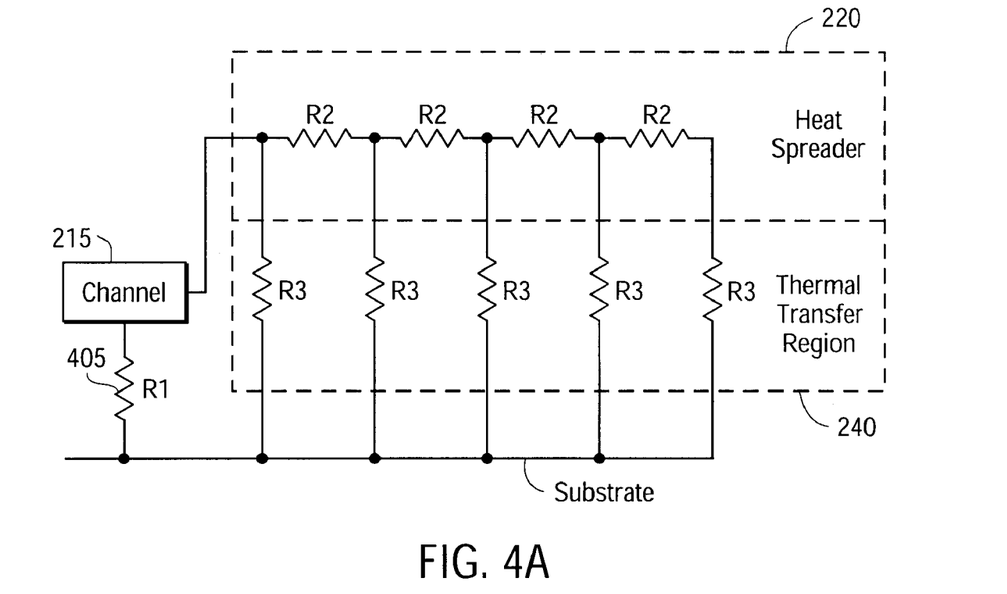
FIG. 4 illustrates thermal resistance models of the FET of FIGS. 2 and 3.

FIG. 4A is an illustrative diagram of a first order approximation of the quasi-steady state heat flow of FET 200. Channel 215 can be modeled as having a first thermal resistance 405 for heat flow directly through the substrate that is inversely proportional to the area of the channel. Consequently, in a FET having a small gate length (e.g., a gate length less than about 0.2 microns), the thermal resistance of the channel will tend to increase rapidly with decreases in gate length. In a silicon-on-insulator embodiment, buried oxide layer 225 underneath channel 215 has a low thermal conductivity compared with channel 215 and the underlying substrate. Consequently, a buried oxide layer 225 acts as a thermal barrier that increases the thermal resistance of channel 215

Figure 4B:
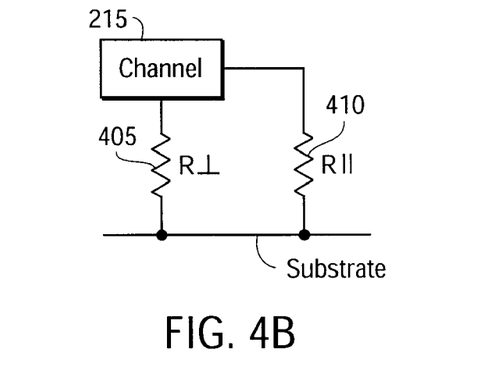

Referring to FIG. 4B, Heat spreader 220 and the silicon layer of thermal transfer region 240 can be modeled as forming a second thermal resistance 410 that acts in parallel with first thermal resistance 405 to dissipate heat to the substrate. As shown in FIG. 4A, second resistor 410 can be further modeled as being the equivalent thermal resistance of forming a thermal resistance network in which the thermal resistance of thermally conducive element 220 is modeled as a chain of lateral thermal resistors R2 coupling heat to the substrate through vertical thermal resistors R3 associated with sub-regions along the length of the silicon layer comprising the thermal transfer region. The use of comparatively thick, high thermal conductivity metals for heat spreader 220 acts to reduce the thermal resistance of each lateral resistor R2. Additionally, increasing the length of the thermal transfer region acts to reduce the resistance of thermal resistor 410.

Computer modeling techniques may be used to select a design for which heat spreader 220 and thermal transfer region 240 have an equivalent thermal resistance 410 that is sufficiently low relative to thermal resistance 405 to reduce the operation temperature of the channel. A preferred method is to use a computer model that includes the effects of both thermal resistance and thermal capacitance. A variety of computer modeling techniques, such as SPICE modeling, may be adapted to calculate expected temperature rise for a particular FET structure. For example, SPICE computer modeling may be use to calculate the power dissipation of a transistor in a circuit block. Computer modeling of the thermal characteristics of the transistor may then be performed by modeling the transistor as a network of thermal resistances and thermal capacitances. The temperature of the channel may then be calculated using conventional thermal modeling techniques.

In one simulation, a gate length of 0.125 microns was assumed along with a gate width of four microns. A silicon-on-insulator structure was assumed having a buried oxide thickness of 0.145 microns. A current source with a pulse frequency of one gigahertz was assumed applying a current of 0.18 mA. A heat spreader with a width of four microns, a length of twelve microns, and a height of 0.345 microns was assumed, with the heat spreader being composed primarily of tungsten and copper. For these parameters, a conventional FET has a channel temperature rise of 70.9° C. for a SOI structure and 61.1° C. for a conventional silicon transistor. The use of a thermal transfer region and heat spreader having a length of two microns decreased the channel temperature rise of a SOI transistor to 37.7° C. and a conventional silicon transistor to 33.77° C., which corresponds to an almost factor of two improvement. The use of a thermal transfer region and heat spreader having a length of twelve microns decreased the channel temperature rise of a SOI transistor to 14.5° C. and a conventional silicon transistor to 10.64° C., corresponding to slightly greater than factor of five improvement.

FET 200 provides the benefit of reducing the thermal resistance of a FET but requires the incorporation of a thermal transfer region that increases the total area of FET 200. One way that FET 200 may be advantageously used is in selected circuit blocks of an integrated circuit that are especially susceptible to heating, particularly circuit blocks that occupy a comparatively small percentage of the total chip area. Heating is a particularly serious problem in circuits that are operated continuously, such as phase locked loop voltage controlled oscillators (PLL VCOs), current references, voltage references, and pull-ups of pseudo-NMOS OR gates. Heating may degrade the performance, precision or lifetimes of these types of circuits. Heating may also be an especially severe problem in digital circuits having high loads or high switching factors (e.g., clock circuits). These include clock repeaters, for which a high operating temperature increases clock skew, and SRAM timing chains, for which heating can reduce the precision of the timing chain.

Figure 5:
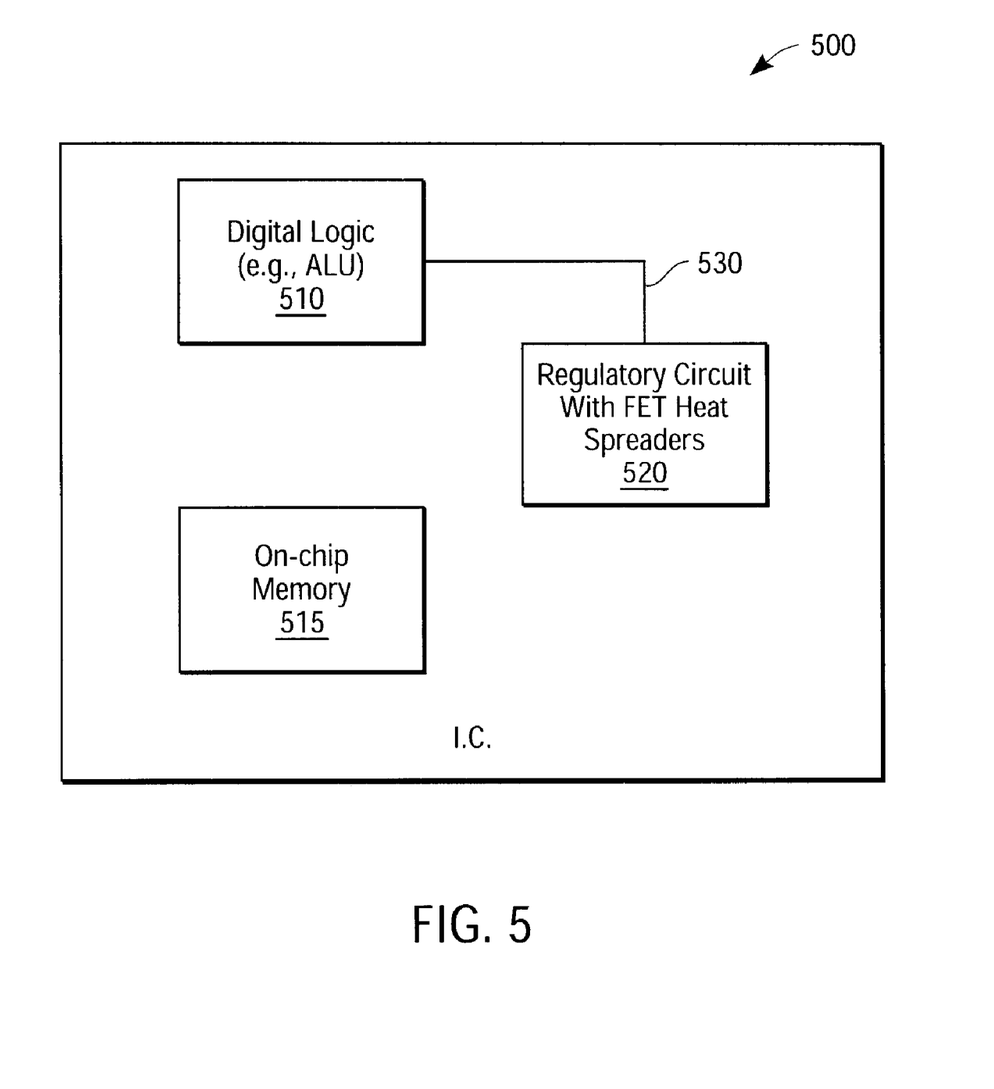
FIG. 5 is a block diagram illustrating how the FET of the present invention may be beneficially used in a circuit block of an integrated circuit that is susceptible to self-heating.

FIG. 5 shows an embodiment of an integrated circuit 500 in which FET 200 is used in selected circuit blocks that are especially susceptible to self-heating for the desired operation conditons. Integrated circuit 500 may have a floorplan that is divided into circuit blocks 510, 515, and 520 based on the function and structure of the circuit block in the integrated circuit. At least one circuit block may be a processor block 510 having dense logic circuit (e.g., an arithmetic logic unit processor). Digital logic circuits have a power dissipation that increases linearly with increasing clock cycle rate. Digital logic circuits are comparatively insensitive to self-heating effects because the average power dissipation is low. An on-chip memory circuit block 515 (e.g., a level 1 or level 2 cache memory) may be included. On-chip memory typically has a low enough average power dissipation that self-heating effects may typically be ignored in an on-chip memory circuit block. Typically the processor blocks(s) 510 and on-chip memory blocks(s) 515 have a large total number of FETs and occupy a substantial fraction of the floorplan of the chip. Consequently, processor blocks) 510 and memory block(s) 515 are preferably fabricated using a conventional FET design in order to maintain an economically desirable high density per unit area of FETs in circuit blocks 510 and 515.

Integrated circuits also often include additional circuit blocks, such as regulatory circuit blocks 520, that occupy a comparatively small area of the total area of the integrated circuit. The regulatory circuit block may include regulatory circuits used to regulate timing, current control, impedance control, input/output control, or provide current protection functions for one or more other circuit blocks of the integrated circuit. Examples of regulatory circuits include timing chains (e.g., SRAM timing circuits), phase locked loops, impedance control circuits (e.g., adaptive I/O circuits), current sources, voltage controlled oscillators, and current limiting and protection circuits (e.g.,electrostatic discharge circuits). Typically, a common semiconductor device fabrication process is used such that the FETs in a regulatory circuit block have the same gate length as transistors in other circuit blocks.

Many types of regulatory circuits are more susceptible to self-heating than digital logic circuits. There are several factors that may make a regulatory circuit block susceptible to self-heating. First, some types of regulatory circuits have a higher average power dissipation compared with digital circuits, such as a regulatory circuit operated on a quasi-continuous basis or one having high loads or high switching factors. This may result in the channel regions of regulatory circuits operating at an excessively high temperature that renders the circuit inoperable or increases the output variance to an unacceptable level. Second, some types of regulatory circuit blocks have a variance of their regulatory output that increases rapidly with temperature.

Referring again to FIG. 5 regulatory circuit block 520 may include FET 200 for every transistor in which self-heating effects are likely to degrade the performance of regulatory circuit block 520. As an illustrative example, a circuit designer could analyze a regulatory output 530 of regulatory circuit block 520 and determine if the use of conventional FETs would result in self-heating that would render regulatory output unacceptable for the desired operation conditions of the integrated circuit 500. A circuit designer could then adjust the area of the thermal transfer region 240 and the thermal characteristics of heat spreader 220 to reduce the thermal resistance (and hence the operating temperature) of the channels of each FET 200 of regulatory circuit block 520 until regulatory output 530 was within the required parameters.

As another illustrative example, it may be desired to have a microprocessor operating at a clock cycle frequency in excess of one gigahertz. The maximum clock cycle frequency with which processor block 510 may be designed to operate is a function of two limitations. First, the individual transistors of processor block 510 must have a sufficient transconductance and high frequency gain to operate at the desired cycle frequency. This may require a comparatively small gate length of conventional FETs and a SOI transistor structure, which will result in a comparatively high thermal resistance of each transistors. However, since digital logic circuits are switched intermittently, the time-average power dissipation may still be sufficiently low to avoid self-heating effects limiting the performance of the processor block 510.

However, there is another limitation on clock cycle frequency imposed by the system requirement that regulatory circuit block 520 be operable at the desired clock frequency (e.g., have a variance of a desired regulatory output 530 consistent with the desired cycle frequency). For example, a PLL is commonly used as a processor clock, and typically includes an on-chip current controlled oscillator. Any fluctuation in the current to the oscillator results in cycle-to-cycle and long-term jitter. The maximum jitter and accumulated phase error of the PLL imposes a limit on the maximum clock frequency. At a high clock cycle frequency, a PLL circuit requires a small jitter. Using a conventional FET circuit design, self-heating effects increase the jitter of a PLL circuit. However, using FETs 200 of the present invention, the temperature rise of FETs in a PLL circuit can be expected to be decreased by as much as a factor of five. The reduction in self-heating reduces the variance (jitter) of the output, which permits the PLL circuit to be operable at a higher clock cycle frequency. Thus, it will be understood that the application of FET 200 to a regulatory circuit may permit an integrated circuit to be operated at an increased clock cycle frequency.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A field effect transistor with reduced self-heating, comprising:
   a semiconductor layer disposed on a substrate, the semiconductor layer having an upper surface and an opposed lower surface;
   a source diffusion region formed in the semiconductor layer;
   a drain diffusion region formed in the semiconductor layer spaced apart from the source diffusion region by a source-to-drain separation distance;
   a gate structure residing on the upper surface of the semiconductor layer adapted to modify the electrical conductance of a channel region disposed between the source diffusion region and the drain diffusion region, the channel region having an associated channel area;
   a metal heat spreader comprising at least one thermally conductive metal formed on the upper surface of the semiconductor layer of one of the diffusion regions adjacent the gate structure;
   the metal heat spreader comprised of at least one thermally conductive metal and extending over a sufficient area of the semiconductor layer reduce a thermal resistance associated with a flow of heat from the channel region to the substrate by at least a factor of two.

2. The transistor of claim 1, wherein the heat spreader is disposed on the surface of the drain diffusion region.

3. The transistor of claim 2, wherein the heat spreader comprises copper.

4. The transistor of claim 1, wherein the gate structure has a gate length of less than 0.15 microns and the thermal transfer region has a length greater than two microns and a width comparable to a width of the gate structure.

5. The transistor of claim 4, wherein the length of the thermal transfer region is at least ten microns.

6. The transistor of claim 1, wherein the heat spreader extends over an area of one of the diffusion regions that is at least ten times the area of the channel region.

7. The transistor of claim 6, wherein the heat spreader is comprised of finger sections.

8. The transistor of claim 7, wherein the metallic heat spreader comprises a metal interconnect and contact layers.

9. The transistor of claim 1, wherein the heat spreader is comprised of metal interconnect layers.

10. The transistor of claim 1, wherein the transistor is a silicon on insulator (SOI) transistor having a buried oxide layer disposed between the semiconductor layer and the substrate and having a first shallow trench isolation region disposed outside the source diffusion region and a second shallow trench isolation region disposed outside the drain diffusion region.

11. The transistor of claim 10, wherein the heat spreader is disposed on the drain diffusion region.

12. The transistor of claim 11, wherein the heat spreader has an area greater than at least ten times the channel area.

13. The transistor of claim 1, further comprising:
    a buried oxide layer disposed between the semiconductor layer and the substrate;
    a first shallow trench isolation region bounding the source diffusion region; and
    a second shallow trench isolation region bounding the drain diffusion region;
    the diffusion region onto which the metallic heat spreader is formed having an extended area greater than a corresponding area of the other diffusion region.

14. The transistor of claim 13, wherein the semiconductor layer onto which the source diffusion region and the drain diffusion region are formed is substantially planar.

15. A silicon on insulator field effect transistor with reduced self-heating, comprising:
    a substrate;
    a buried oxide layer disposed on a portion of the substrate;
    a surface silicon layer disposed on the buried oxide layer, the surface silicon layer having an upper surface and an opposed lower surface;
    a source diffusion region formed in the surface silicon layer;
    a drain diffusion region formed in the surface silicon layer spaced apart from the source diffusion region by a source-to-drain separation distance;
    a channel region in the surface silicon layer disposed between the source diffusion region and the drain diffusion region, the channel region having a channel area;
    a gate structure disposed on the surface of the silicon surface layer region above the channel region adapted to modify the electrical conductance of the channel region, the gate structure having a gate length less than 0.15 microns; and
    a metal heat spreader formed on the upper surface of the drain diffusion region adjacent the channel region, the heat spreader extending over an area at least about ten times greater than the channel area;
    the metal heat spreader configured to substantially reduce a thermal resistance associated with a flow of heat from the channel region through the semiconductor layer into the substrate.

16. A silicon on insulator field effect transistor with reduced self-heating, comprising:
    a substrate;
    a buried oxide layer disposed on a portion of the substrate;
    a surface silicon layer disposed on the buried oxide layer, the surface silicon layer having an upper surface and an opposed lower surface;
    a source diffusion region formed in the surface silicon layer;
    a drain diffusion region formed in the surface silicon layer spaced apart from the source diffusion region by a source-to-drain separation distance;
    a channel region in the surface silicon layer disposed between the source diffusion region and the drain diffusion region, the channel region having a channel area;

a gate structure disposed on the surface of the silicon surface layer region above the channel region adapted to modify the electrical conductance of the channel region; and a metal heat spreader formed on the upper surface of the drain diffusion region adjacent the channel region;

the metal heat spreader including a copper interconnect, the metal heat spreader extending over an area of the drain diffusion region at least about ten times greater than the channel area to substantially reduce a thermal resistance associated with a flow of heat from the channel region through the source diffusion region into the substrate.

17. The transistor of claim 16, wherein the heat spreader reduces the thermal resistance of the channel region by at least a factor of two.

* * * * *